(12) United States Patent
Ito et al.

(10) Patent No.: US 10,475,851 B2
(45) Date of Patent: Nov. 12, 2019

(54) STORAGE DEVICE AND METHOD OF MANUFACTURING STORAGE DEVICE

(71) Applicant: TOSHIBA MEMORY CORPORATION, Tokyo (JP)

(72) Inventors: Yuichi Ito, Yokkaichi Mie (JP); Kouji Matsuo, Ama Aichi (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/120,075

(22) Filed: Aug. 31, 2018

(65) Prior Publication Data

US 2019/0296078 A1 Sep. 26, 2019

(30) Foreign Application Priority Data

Mar. 20, 2018 (JP) ................. 2018-052630

(51) Int. Cl.
  *H01L 27/22* (2006.01)
  *H01L 45/00* (2006.01)
  *H01L 43/02* (2006.01)
  *H01L 43/12* (2006.01)

(52) U.S. Cl.
  CPC ............ *H01L 27/224* (2013.01); *H01L 43/02* (2013.01); *H01L 43/12* (2013.01); *H01L 45/065* (2013.01); *H01L 45/1233* (2013.01); *H01L 45/1253* (2013.01); *H01L 45/141* (2013.01); *H01L 45/1608* (2013.01)

(58) Field of Classification Search
  None
  See application file for complete search history.

(56) References Cited

U.S. PATENT DOCUMENTS

| | | | |
|---|---|---|---|
| 6,839,271 B1 | 1/2005 | Anthony et al. |
| 7,522,446 B2 | 4/2009 | Lee et al. |
| 7,829,923 B2 | 11/2010 | Li et al. |
| 8,273,582 B2 | 9/2012 | Nozieres et al. |
| 8,895,323 B2 | 11/2014 | Guha |
| 2014/0063924 A1 | 3/2014 | Nakai et al. |
| 2016/0268273 A1 | 9/2016 | Nakao |
| 2017/0244026 A1 | 8/2017 | Wu et al. |

(Continued)

FOREIGN PATENT DOCUMENTS

| | | |
|---|---|---|
| JP | 2014049497 A | 3/2014 |
| TW | 201032369 A | 9/2010 |

(Continued)

*Primary Examiner* — Asok K Sarkar
(74) *Attorney, Agent, or Firm* — Kim & Stewart LLP

(57) ABSTRACT

According to one embodiment, a method of manufacturing a storage device comprises forming a state change layer on a substrate. The state change layer has first and second resistance states. The state change layer is switchable from one to the other of the first and second resistance states according to a magnitude of a voltage applied thereto. A conductor is formed on an upper surface of the state change layer. The conductor comprises carbon. An upper surface of the conductor is processed to reduce the roughness thereof. A first ferromagnetic material is then formed on the upper surface of the conductor. A nonmagnetic material is formed on an upper surface of the first ferromagnetic material. A second ferromagnetic material is formed on an upper surface of the nonmagnetic material.

20 Claims, 12 Drawing Sheets

(56) References Cited

U.S. PATENT DOCUMENTS

| | | |
|---|---|---|
| 2017/0250222 A1 | 8/2017 | Wu et al. |
| 2018/0040669 A1* | 2/2018 | Wu ....................... H01L 23/528 |
| 2019/0140023 A1* | 5/2019 | Hu ...................... H01L 27/2481 |

FOREIGN PATENT DOCUMENTS

| | | |
|---|---|---|
| TW | 201338225 A | 9/2013 |
| TW | 201740585 A | 11/2017 |
| TW | 201742283 A | 12/2017 |

\* cited by examiner

STORAGE DEVICE AND METHOD OF MANUFACTURING STORAGE DEVICE

CROSS-REFERENCE TO RELATED APPLICATION

This application is based upon and claims the benefit of priority from Japanese Patent Application No. 2018-052630, filed, Mar. 20, 2018, the entire contents of which are incorporated herein by reference.

FIELD

Embodiments described herein relate generally to a storage device and a method of manufacturing the storage device.

BACKGROUND

A storage device that stores data using a magneto-resistive effect is known.

DETAILED DESCRIPTION

Figure 1:
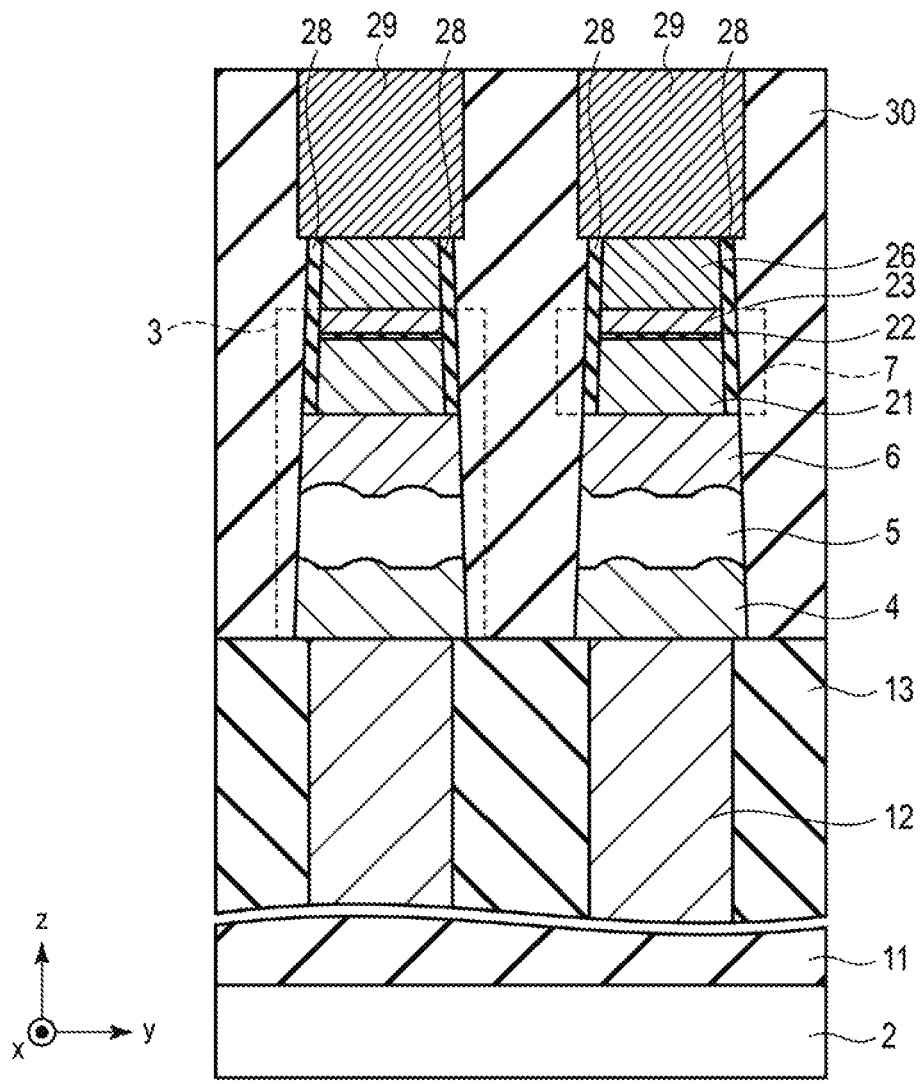
FIG. 1 illustrates a cross section of a portion of a magnetic storage device according to a first embodiment.

Embodiments provide a storage device including a high-performance memory element.

In general, according to one embodiment, a method of manufacturing a storage device includes forming a state change layer on a substrate. The state change layer has a first resistance state and a second resistance state. The state change layer is switchable from one to the other of the first and second resistance states according to a magnitude of a voltage applied thereto. The method further includes forming a conductor on an upper surface of the state change layer, the conductor comprising carbon, processing an upper surface of the conductor to reduce roughness thereof, forming a first ferromagnetic material on the upper surface of the conductor after the processing to reduce the roughness thereof, forming a nonmagnetic material on an upper surface of the first ferromagnetic material, and forming a second ferromagnetic material on an upper surface of the nonmagnetic material.

Example embodiments will be described below with reference to the drawings. In the following description, elements having substantially the same function and configuration are denoted by the same reference numerals, and repetitive explanation of such elements may be omitted. The drawings are schematic, and for example, the relationship between the thickness and other dimensions and/or the ratio of the thicknesses of layers may be different from those in an actual device. In addition, each of the drawings may have different dimensional relationships and ratios. In addition, in general descriptions of particular example embodiments may also be suitable as descriptions of any other embodiment unless such descriptions are explicitly and/or obviously excluded. The embodiments are examples of an apparatus or a method embodying the technical concept(s) of the present disclosure, and these technical concept(s) are not necessarily reliant on the specific, for example, material, shape, structure, and arrangements depicted in the drawings or particularly selected in the following examples.

First Embodiment

FIG. 1 illustrates a cross section of a portion of a magnetic storage device 1 of a first embodiment. As illustrated in FIG. 1, the magnetic storage device 1 includes a substrate 2 and a plurality of memory cells 3 above (along z-axis) the upper surface (parallel to the xy plane) of the substrate 2. FIG. 1 illustrates two memory cells 3 for purposes of explanatory convenience. Each memory cell 3 includes at least a lower electrode 4, a state change layer 5, an upper electrode 6, and a variable resistance element 7, and may include, in some examples, one or more additional layers. A more detailed structure of the magnetic storage device 1 is as follows.

An insulator 11 is provided on the upper surface of the substrate 2. A plurality of conductors 12 are provided above the insulator 11 along the z-axis. The conductors 12 are independent of each other. An insulator 13 is provided in an area between the conductors 12.

On the upper surface of each conductor 12, one memory cell 3 is located and the lower electrode 4 of one memory cell is provided in contact with the conductor 12. The lower electrode 4 is electrically conductive and is provided to prevent heat, which is generated by the state change layer 5 located on the lower electrode 4, from being transferred to surrounding elements via conduction through the lower electrode 4. A material that has a low thermal conductivity for limiting the conduction of heat from the state change layer 5 and is capable of being processed for use in the magnetic storage device 1 is used as a material of the lower electrode 4. An example of such a material is carbon, and the material of the lower electrode may include carbon as a component, or may be formed of carbon.

Carbon has a high arithmetic average roughness Ra (hereinafter simply referred to as "roughness") on the surface thereof, and the roughness Ra thereof is typically less than about 0.3 (Ra<0.3). By using such a material, the upper surface of the lower electrode 4 will have a high roughness.

The state change layer 5 is located on the upper surface of the lower electrode 4. The state change layer 5 may include a selector. The selector may be, for example, a switch element operating between two terminals. As one example, when a voltage applied between the two terminals is equal to or less than a threshold, the switch element is in a "high resistance" state, for example, an electrically nonconductive state. When a voltage applied between the two terminals is equal to or larger than a threshold, the switch element changes to a "low resistance" state, for example, an electrically conductive state. The switch element can be configured to perform this function regardless of a polarity of voltage. In this example, the switch element may include at least one chalcogen element selected from among a group consisting of tellurium (Te), selenium (Se), and sulfur (S). In other examples, the switch element may include a chalcogenide that is a compound including a chalcogen element. In addition to this, the switch element may contain at least one element selected from among the group consisting of boron (B), aluminum (Al), gallium (Ga), indium (In), carbon (C), silicon (Si), germanium (Ge), tin (Sn), arsenic (As), phosphorus (P), and Sb (antimony).

The state change layer 5 is located on the lower electrode 4 having a high roughness on the upper surface thereof. Therefore, the shape of the state change layer 5 depends on the roughness of the upper surface of the lower electrode 4 when the state change layer 5 is formed thereon. In general, the upper surface of the state change layer 5 thus formed will also have a high roughness. Therefore, the roughness of the upper surface of the state change layer 5 will be equal to or higher than the roughness of the upper surface of the lower electrode 4.

The upper electrode 6 is located on the upper surface of the state change layer 5. Similarly to the lower electrode 4, the upper electrode 6 has conductivity and is provided in order to prevent heat, which is generated by the state change layer 5, from being transferred to surrounding elements through the upper electrode 6. As a material of the upper electrode 6, a material, which has a low thermal conductivity helpful for preventing the conduction of heat from the state change layer 5 and is capable of being processed and formed to have a required property for use in the magnetic storage device 1, is used. As such a material, the upper electrode 6 may comprise the same material(s) as the lower electrode 4, or may be the same material. For example, the upper electrode 6 may contain carbon, or may be carbon.

The upper electrode 6 is located on the state change layer 5, which has a high roughness on the upper surface thereof. The shape of the upper electrode 6 depends on the roughness of the upper surface of the state change layer 5 when the upper electrode 6 is formed thereon, and the upper surface of the upper electrode 6 therefore has a high roughness. In addition, the upper electrode 6 may have a high roughness on the upper surface thereof due to a fact that it is a material that similarly satisfies the same requirements as those of the lower electrode 4. For these reasons, depending on a formation method thereof, the roughness of the upper surface of the upper electrode 6 may be equal to or higher than the roughness of the upper surface of the state change layer 5. However, the roughness of the upper surface of the upper electrode 6 can also be lower than the roughness of the upper surface of the state change layer 5 and/or the lower surface of the upper electrode 6. This aspect will be described in more detail in description of a manufacturing method.

One variable resistance element 7 is provided on the upper surface of each upper electrode 6 so as to correspond thereto. Each variable resistance element 7 may take two different resistance values that may be switched from one to the other under particular conditions. Here, each variable resistance element 7 includes a plurality of layers stacked along the z axis. The variable resistance element 7 may include various kinds of layers based on the intended characteristics of the variable resistance element 7. An example of the variable resistance element 7 is a magnetic tunnel junction (MTJ) element including two ferromagnetic materials. FIG. 1 illustrates such an example, and the following description is based on an example in which the variable resistance element 7 is an MTJ element. Hereinafter, the variable resistance element 7 may be referred to as an MTJ element 7, but the disclosure is not limited to MTJ elements.

When variable resistance element 7 is an MTJ element, the MTJ element 7 includes a ferromagnetic material 21, an insulating nonmagnetic material 22, and a ferromagnetic material 23. The ferromagnetic material 21 is located on the upper electrode 6, the nonmagnetic material 22 is located on the ferromagnetic material 21, and the ferromagnetic material 23 is located on the nonmagnetic material 22. During a normal operation of the magnetic storage device 1, the direction of magnetization of the ferromagnetic material 21 is substantially invariable, whereas the direction of magnetization of the ferromagnetic material 23 is variable. The ferromagnetic materials 21 and 23, for example, have magnetization axes along the direction crossing the interfaces between the ferromagnetic material 21 and the nonmagnetic material 22, and between the ferromagnetic material 23 and the nonmagnetic material 22. The combination of the ferromagnetic material 21, the nonmagnetic material 22, and the ferromagnetic material 23 exhibits a magneto-resistive effect. Specifically, when the directions of magnetization of the ferromagnetic materials 21 and 23 are parallel to each other, the MTJ element 7 exhibits the minimum resistance value. On the other hand, when the directions of magnetization of the ferromagnetic materials 21 and 23 are anti-parallel (opposite directions), the MTJ element exhibits the maximum resistance value. The states corresponding to the two different resistance values may be assigned values for representing binary data, respectively.

When a write current having a certain magnitude flows from the ferromagnetic material 23 to the ferromagnetic material 21, the direction of magnetization of the ferromagnetic material 23 becomes parallel to the direction of magnetization of the ferromagnetic material 21. On the other hand, when a write current having a certain magnitude flows from the ferromagnetic material 21 to the ferromagnetic material 23, the direction of magnetization of the ferromagnetic material 23 becomes anti-parallel to the direction of magnetization of the ferromagnetic material 21.

A conductive cap film 26 is located on the upper surface of each MTJ element 7. A conductor 29 is located on the upper surface of each cap film 26.

The side surface of the MTJ element 7 and the side surface of the cap film 26 is covered with an insulator 28. In an area above the insulator 13 in the magnetic storage device 1, an insulator 30 is provided in a portion in which the memory cell 3 (the lower electrode 4, the state change layer 5, the upper electrode 6, and the variable resistance element 7), the cap film 26, the conductor 29, the insulator 28 are not provided.

The lower electrode 4 need not be provided in all embodiments. In such a case, the state change layer 5 is located on the upper surface of each electric conductor 12 so as to correspond thereto.

Next, a method of manufacturing the magnetic storage device of the first embodiment will be described with reference to FIGS. 1 to 8. FIGS. 2 to 8 sequentially illustrate various states during the manufacturing process of the magnetic storage device 1 illustrated in FIG. 1.

Figure 2:
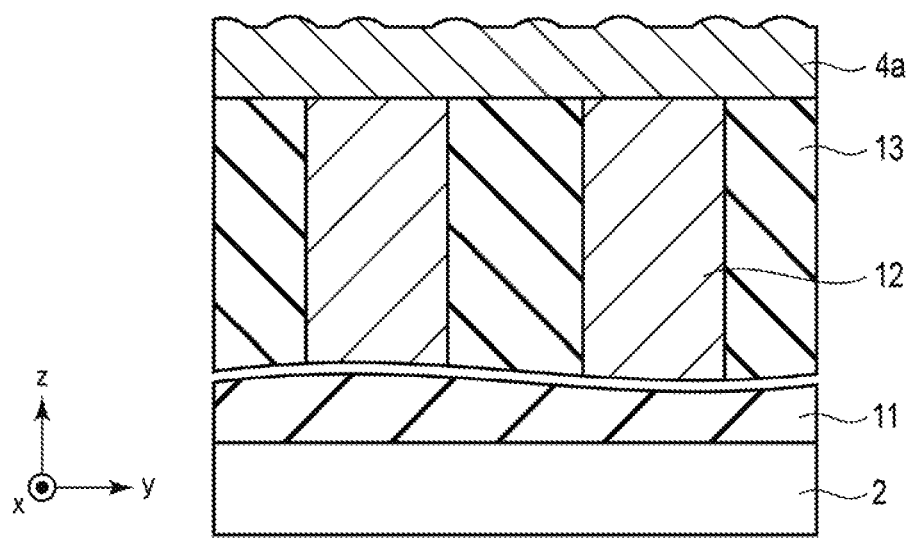
FIG. 2 illustrates aspects of a manufacturing process of a magnetic storage device according to a first embodiment.

As illustrated in FIG. 2, the insulator 11, the conductor 12, and the insulator 13 are formed on the substrate 2. Specifically, first, the insulator 13 is formed on the insulator 11. Subsequently, an opening is formed in a predetermined region of the insulator 13 by a lithography process and etching such as, for example, reactive ion etching (RIE). The conductor 12 is formed in the opening by depositing a conductor material in the opening.

Next, a layer 4a is formed on the entirety of the upper surface of the structure obtained in the manufacturing process so far. The layer 4a is a material that is eventually processed into the lower electrode 4 by being partially removed in a subsequent process. The upper surface of the layer 4a has a high roughness.

Figure 3:
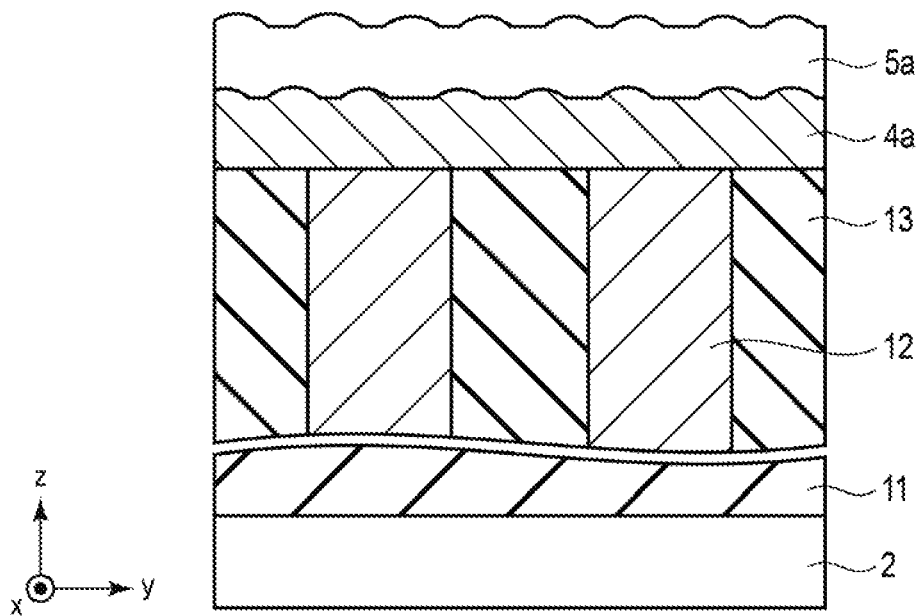
FIG. 3 illustrates further aspects of a manufacturing process of a magnetic storage device according to a first embodiment.

As illustrated in FIG. 3, a layer 5a is formed on the entirety of the upper surface of the structure obtained in the manufacturing process so far. The layer 5a is a material that is processed into the state change layer 5 by being partially removed in a subsequent process. The shape of the layer 5a depends on the roughness of the upper surface of the layer 4a, which is the underlayer of the layer 5a. Since the upper surface of the layer 4a has a high roughness, the upper surface of the layer 5a has a high roughness depending on the roughness of the upper surface of the layer 4a.

Figure 4:
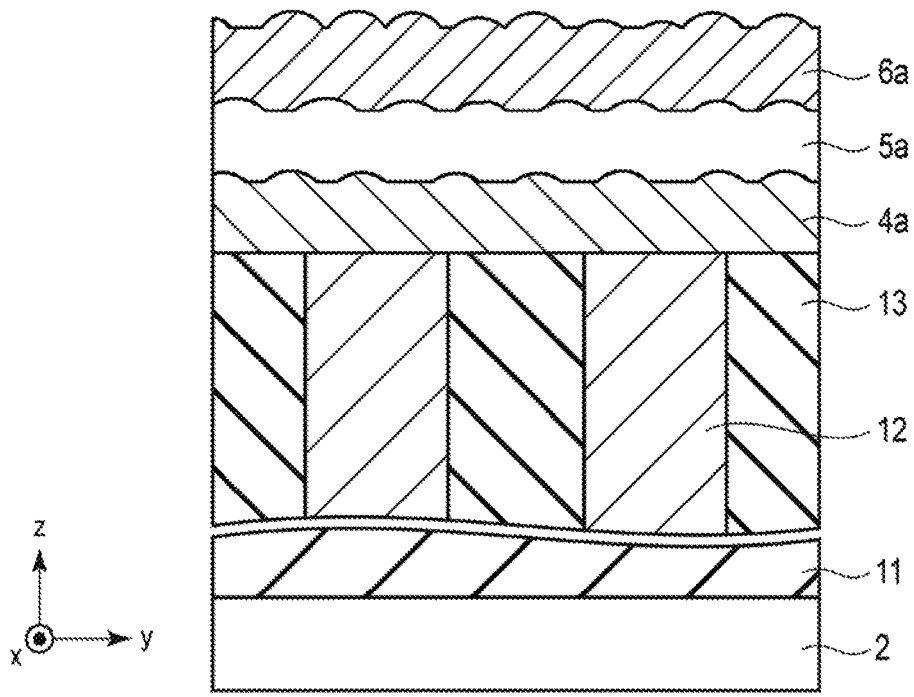
FIG. 4 illustrates further aspects of a manufacturing process of a magnetic storage device according to a first embodiment.

As illustrated in FIG. 4, a layer 6a is formed on the entirety of the upper surface of the layer 5a. The layer 6a is a material that is processed into the upper electrode 6 by being partially removed in a subsequent process. The shape of the layer 6a depends on the roughness of the upper surface of the layer 5a, which is the underlayer of the layer 6a. Since the upper surface of the layer 5a has a high roughness, the upper surface of the layer 6a has a high roughness.

Figure 5:
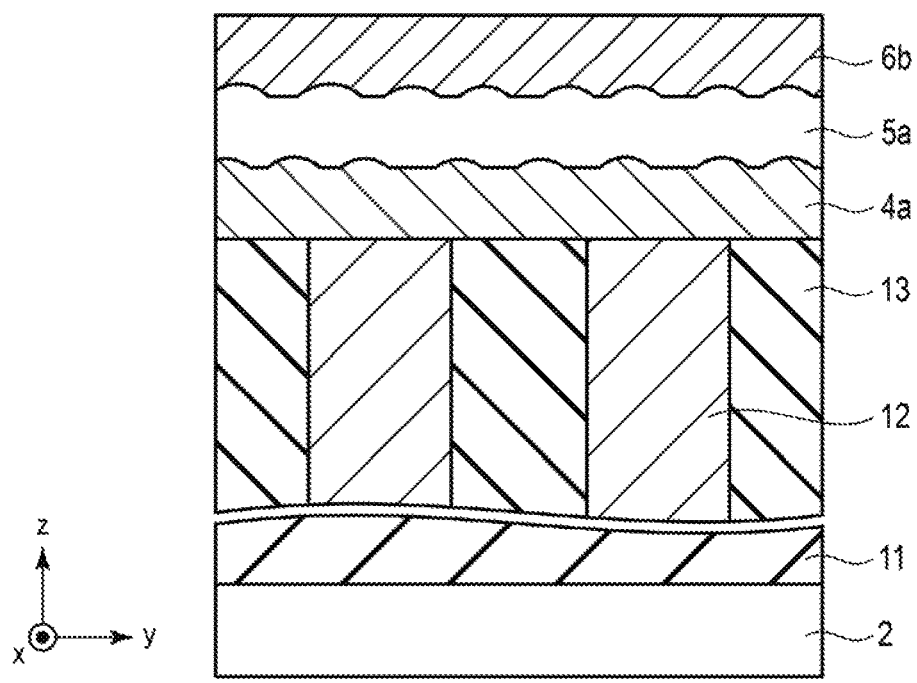
FIG. 5 illustrates further aspects of a manufacturing process of a magnetic storage device according to a first embodiment.

As illustrated in FIG. 5, the upper surface of the layer 6a is planarized by chemical mechanical polishing (CMP). As a result, the roughness of the upper surface of the layer 6a is reduced. After the processing of FIG. 4, the layer 6a, the upper surface roughness having been reduced, is referred to as a layer 6b.

Figure 6:
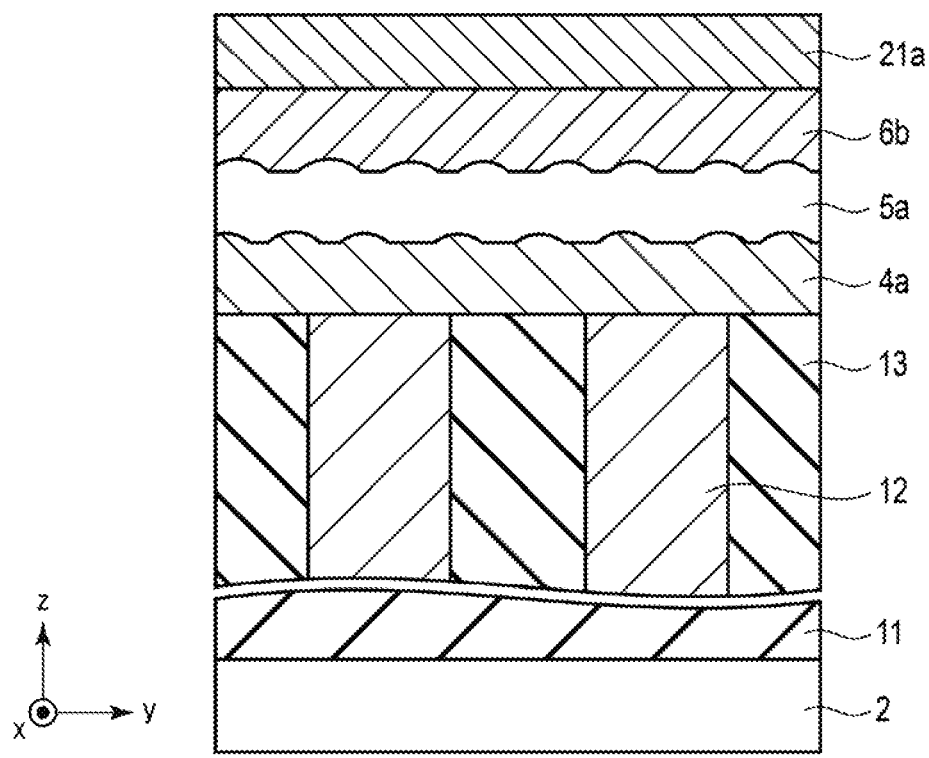
FIG. 6 illustrates further aspects of a manufacturing process of a magnetic storage device according to a first embodiment.

As illustrated in FIG. 6, a ferromagnetic material 21a is formed on the entirety of the upper surface of the layer 6b. The ferromagnetic material 21a is a material that is processed into the ferromagnetic material 21 by being partially removed in a subsequent process. The shape of the ferromagnetic material 21a depends on the roughness of the upper surface of the layer 6b, which is the underlayer of the ferromagnetic material 21a. Since the upper surface of the layer 6b has a low roughness, the upper surface of the ferromagnetic material 21a has a low roughness.

Figure 7:
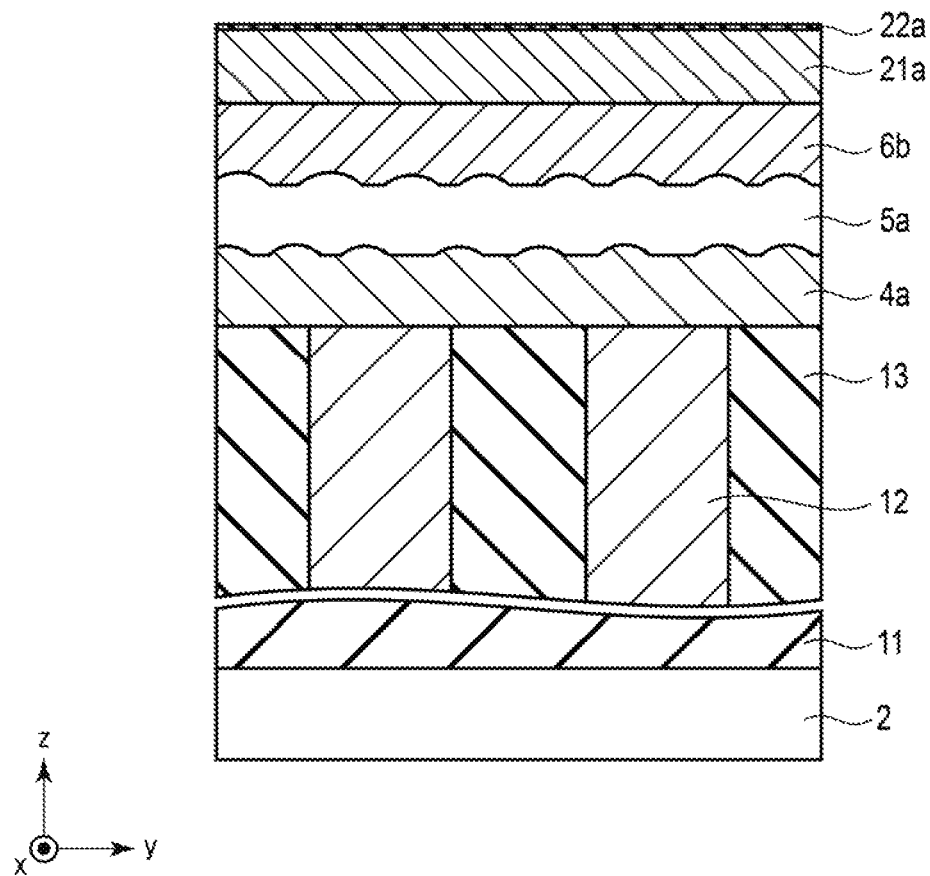
FIG. 7 illustrates further aspects of a manufacturing process of a magnetic storage device according to a first embodiment.

As illustrated in FIG. 7, a nonmagnetic material 22a is formed on the entirety of the upper surface of the ferromagnetic material 21a. The nonmagnetic material 22a is a material that is processed into the nonmagnetic material 22 by being partially removed in a subsequent process. The shape of the nonmagnetic material 22a depends on the roughness of the upper surface of the ferromagnetic material 21a, which is the underlayer of the nonmagnetic material 22a. Since the upper surface of the ferromagnetic material 21a has a low roughness, the upper surface of the nonmagnetic material 22a also has a low roughness.

Figure 8:
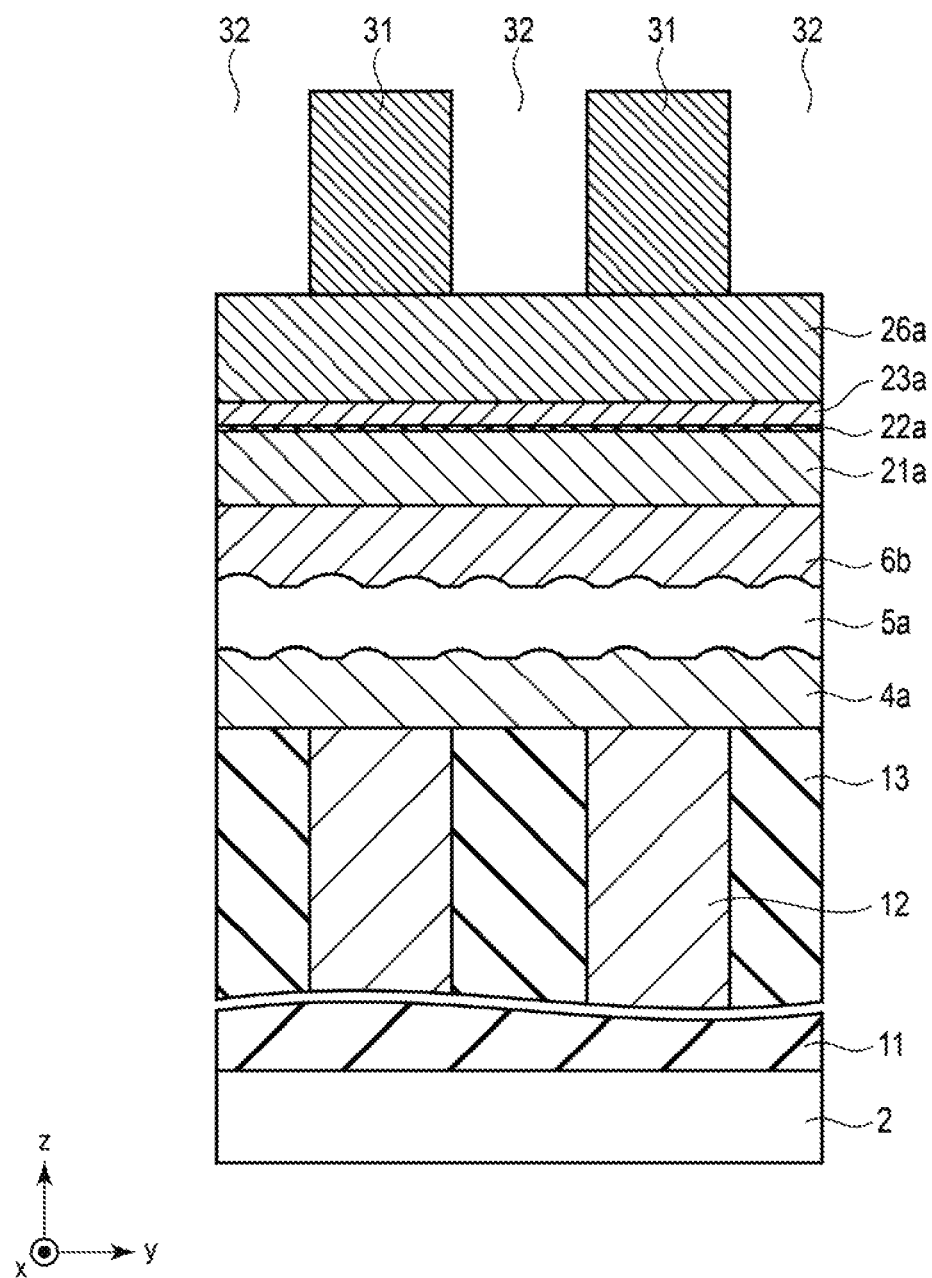
FIG. 8 illustrates further aspects of a manufacturing process of a magnetic storage device according to a first embodiment.

As illustrated in FIG. 8, a ferromagnetic material 23a and a conductor 26a are stacked in this sequence on the entirety of the upper surface of the nonmagnetic material 22a. The ferromagnetic material 23a and the conductor 26a are materials that are processed into the ferromagnetic material 23 and the cap film 26 by being partially removed in a subsequent process. The ferromagnetic material 23a is formed on the nonmagnetic material 22a having a low roughness. Therefore, the upper surface of the ferromagnetic material 23a has a low roughness.

A mask material 31 is formed on the upper surface of the conductor 26a. The mask material 31 remains above a predetermined area in which the memory cell 3 is to be formed, and has an opening 32 in a location excluding the remaining portion thereof. The opening 32 exposes a portion of the conductor 26a. By etching using the mask material 31 as a patterning mask, portions of the conductor 26a, the ferromagnetic material 23a, the nonmagnetic material 22a, the ferromagnetic material 21a, the layer 6b, the layer 5a, and the layer 4a can be etched. As a result, as illustrated in FIG. 1, the memory cell 3 is formed. The etching may be performed in a single process, or may be performed two or more processes with different conditions and/or etchant types. Subsequently, the insulator 28, the conductor 29, and the insulator 30 are formed, whereby the structure of FIG. 1 is obtained.

According to the first embodiment, as described below, the magnetic storage device 1 including the memory cell 3 with good characteristics may be manufactured.

The characteristics of the MTJ element 7 greatly depend on the characteristics of the nonmagnetic material 22. Thus, form the MTJ element 7 with good performance, it is necessary to form the nonmagnetic material 22 with good characteristics. The characteristics of the nonmagnetic material 22 depend on the shape of the nonmagnetic material 22. Thus, in order to form the nonmagnetic material 22 with good characteristics, for example, the nonmagnetic material 22 may have a shape that is as flat as possible along the xy plane, and may have a thickness that varies little along the xy plane. The nonmagnetic material 22 is very thin, and the thickness thereof is, for example, only about 4 to 5 atoms. Therefore, since the nonmagnetic material 22 is formed by etching the nonmagnetic material 22a, in order to form the nonmagnetic material 22 with good characteristics, it is necessary to form the nonmagnetic material 22a, which has a shape that is as flat as possible along the xy plane and which has a thickness that varies little along the xy plane. To this end, it is necessary to form the ferromagnetic material 21a having the upper surface with a low roughness. This is because the shape of the nonmagnetic material 22a depends on the roughness of the upper surface of the ferromagnetic material 21a, which is the underlayer thereof.

In general, however, it is difficult to form the upper surface of the underlayer of an ultrathin layer, such as the nonmagnetic material 22a, so as to have a low roughness that allows the ultrathin layer to be formed with a uniform thickness that varies little along the xy plane. Therefore, it is difficult to form the ferromagnetic material 21a so as to have a low roughness that allows the nonmagnetic material 22a to be formed to have a uniform thickness that varies little along the xy plane. Thus, when the nonmagnetic material 22a is formed on the upper surface of the ferromagnetic material 21a having a roughness that is not sufficiently low, the nonmagnetic material 22a having desired characteristics may not be formed.

This problem is particularly conspicuous when a layer, having a high roughness on the upper surface thereof, is formed below the nonmagnetic material 22a. This is because the high roughness of the upper surface of such a layer affects the roughness of the upper surface of a layer thereon, and also affects the roughness of the upper surface of the layer 6a, which is the underlayer of the nonmagnetic material 22a.

According to the first embodiment, the upper surface of the layer 6a is planarized by CMP, and has a low roughness. Therefore, the ferromagnetic material 21a, formed on the upper surface of the layer 6a, also has the upper surface with a low roughness. Thus, the nonmagnetic material 22a, which has a shape that is nearly parallel along the xy plane and which has a thickness that varies little along the xy plane, may be formed. Thus, the MTJ element 7 with good characteristics may be formed.

Second Embodiment

The second embodiment is different from the first embodiment in terms of a method of planarizing the upper surface of the layer 6a. The others aspects of the second embodiment are the same as those of the first embodiment.

Figure 9:
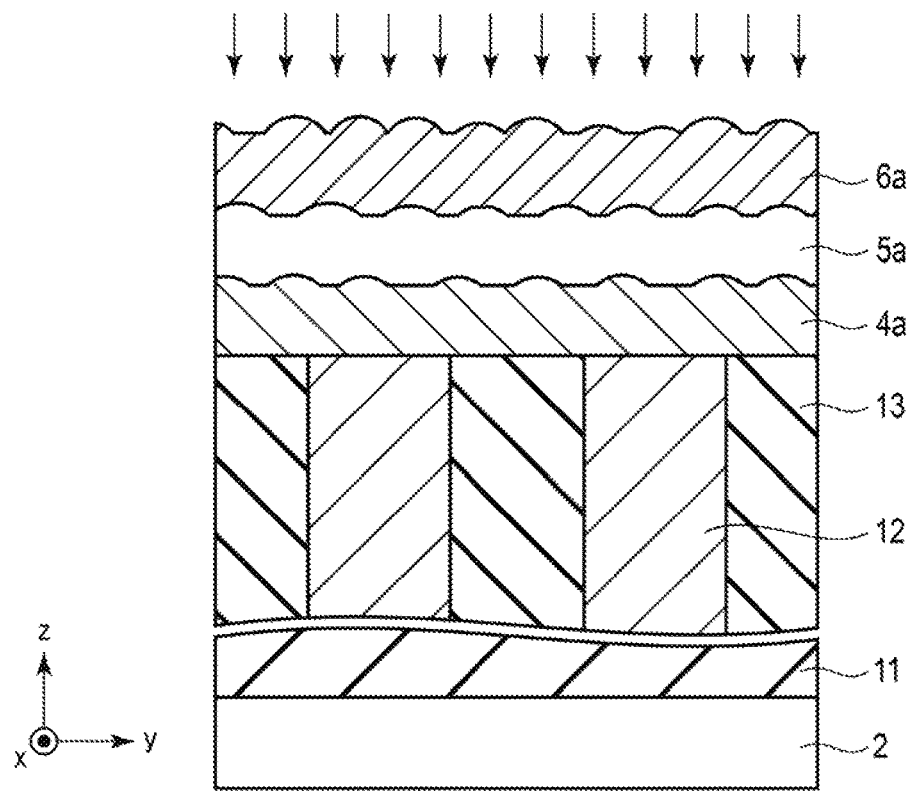
FIG. 9 illustrates aspects of a manufacturing process of a magnetic storage device according to a second embodiment.
Figure 10:
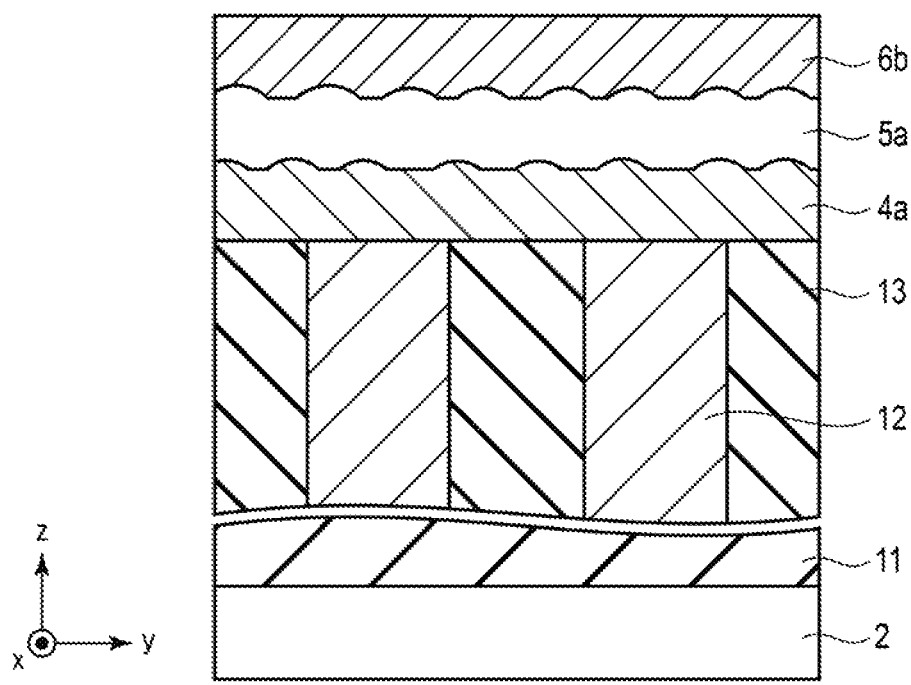
FIG. 10 illustrates further aspects of a manufacturing process of a magnetic storage device according to a second embodiment.

FIGS. 9 and 10 sequentially illustrate states during manufacturing processes of the magnetic storage device 1 of the second embodiment. The state depicted in FIG. 9 follows the state depicted in FIG. 4 for the first embodiment, and the state depicted in FIG. 10 follows the state of depicted in FIG. 9.

As illustrated in FIG. 9, the upper surface of the layer 6a, obtained by the manufacturing processes up to FIG. 4, is planarized. The planarization may be performed by, for example, reverse sputtering (resputtering) and/or ion beam etching (IBE).

As illustrated in FIG. 10, the roughness of the upper surface of the layer 6a is reduced by the planarization process of FIG. 9. By the planarization, the layer 6a becomes the layer 6b having an upper surface with a lower roughness. After the process of FIG. 10 the processing of FIG. 6 and so on of the first embodiment is performed.

According to the second embodiment, the upper surface of the layer 6a is planarized by reverse sputtering and/or IBE to provide a low upper surface roughness as in the first embodiment. Therefore, the same advantages as in the first embodiment may be obtained.

Third Embodiment

Figure 11:
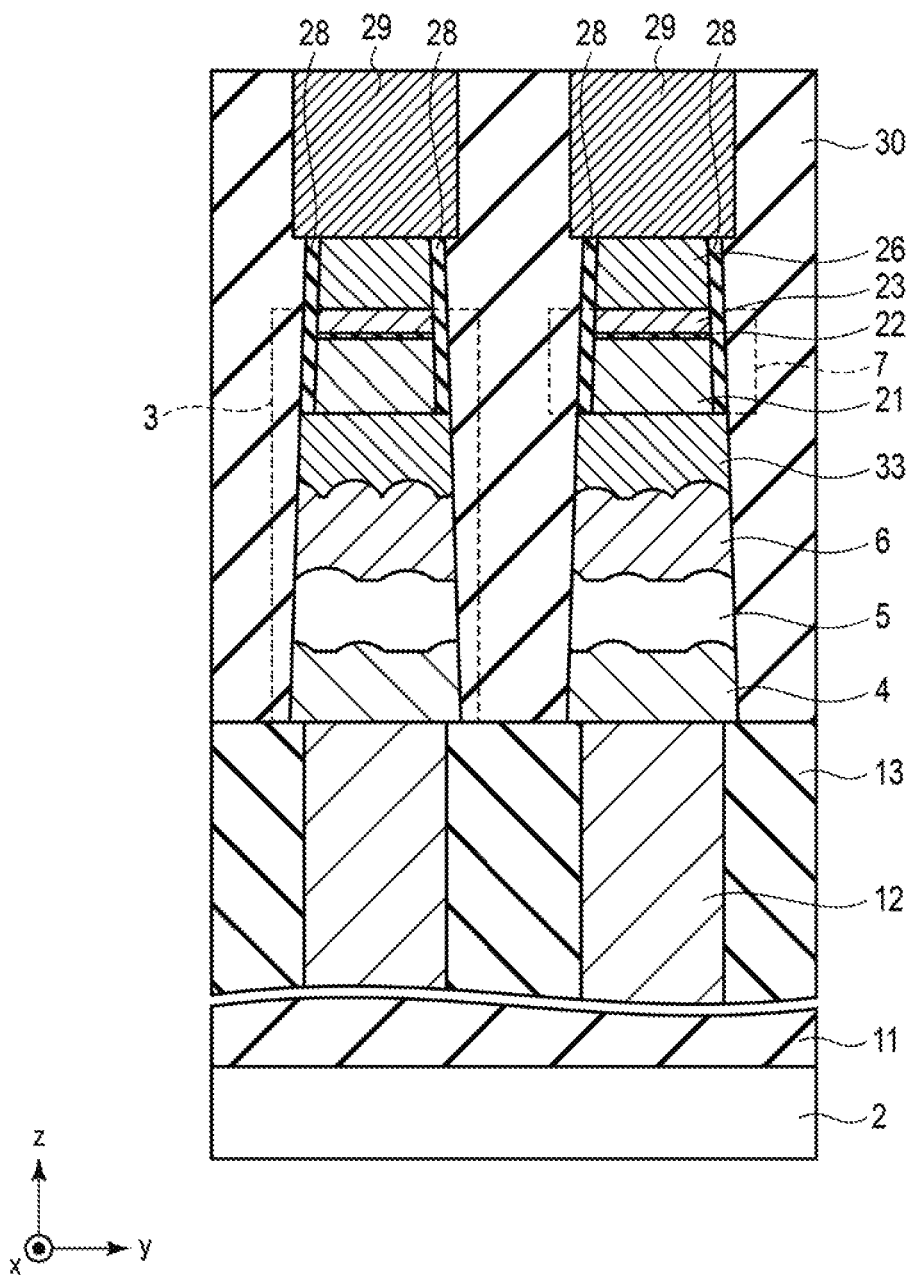
FIG. 11 illustrates a cross section of a portion of the magnetic storage device according to a third embodiment.

FIG. 11 illustrates a cross section of a portion of the magnetic storage device 1 of a third embodiment.

As illustrated in FIG. 11, the upper electrode 6 is located on a state change layer 5 that has a high roughness on the upper surface thereof. The shape of the upper electrode 6 depends on the roughness on the upper surface of the state change layer 5 present when the upper electrode 6 is formed thereon, and the upper surface of the upper electrode 6 will have a high roughness accordingly. Therefore, the roughness of the upper surface of the upper electrode 6 is equal to or higher than the roughness of the upper surface of the state change layer 5.

The memory cell 3 further includes a buffer layer 33, in addition to the aspects of the memory cell 3 of the first embodiment. Each buffer layer 33 is located on the upper surface of an upper electrode 6. The buffer layer 33 is formed of a conductive material. For example, the buffer layer 33 may be tantalum (Ta) and/or titanium nitride (TiN), or may be formed of tantalum (Ta) and/or titanium nitride (TiN).

The roughness of the lower surface of the buffer layer 33 may be equal to or higher than the roughness of the upper surface of the upper electrode 6. However, the roughness of the upper surface of the buffer layer 33 is lower than the roughness of the upper surface of the upper electrode 6 and the lower surface of the buffer layer 33.

The MTJ element 7 is located on the upper surface of each buffer layer 33.

Figure 12:
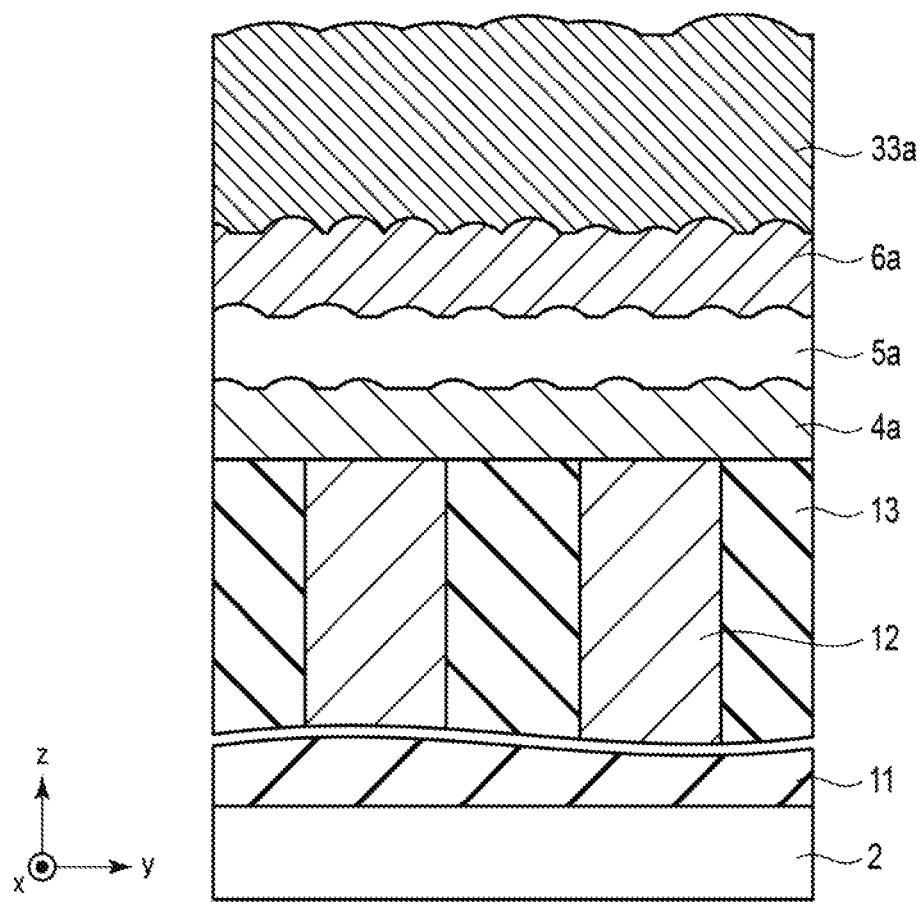
FIG. 12 illustrates aspects of a manufacturing process of a magnetic storage device according to a third embodiment.
Figure 13:
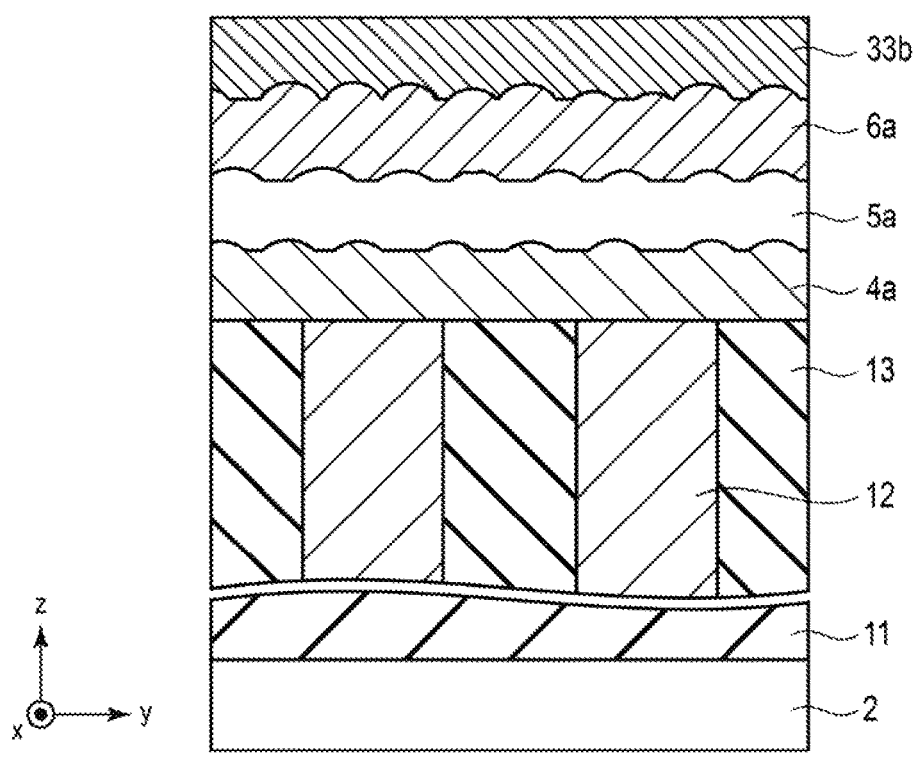
FIG. 13 illustrates further aspects of a manufacturing process of a magnetic storage device according to a third embodiment.

FIGS. 12 and 13 sequentially illustrate states during manufacturing processes of the magnetic storage device 1 of the third embodiment. The state depicted in FIG. 12 follows the state depicted in FIG. 4 of the first embodiment, and the state depicted in FIG. 13 follows the state depicted in FIG. 11.

As illustrated in FIG. 12, a layer 33a is formed on the entirety of the upper surface of the layer 6a obtained by the manufacturing processes up to and including that of FIG. 4. The layer 33a is a material that is eventually processed into the buffer layer 33 by being partially removed in a subsequent process. Since the upper surface of the layer 6a has a high roughness, the layer 33a has a high roughness.

As illustrated in FIG. 13, the upper surface of the layer 33a is planarized by CMP. As a result, the roughness of the upper surface of the layer 33a is reduced, and a layer 33b can be considered formed from the layer 33a.

Figure 14:
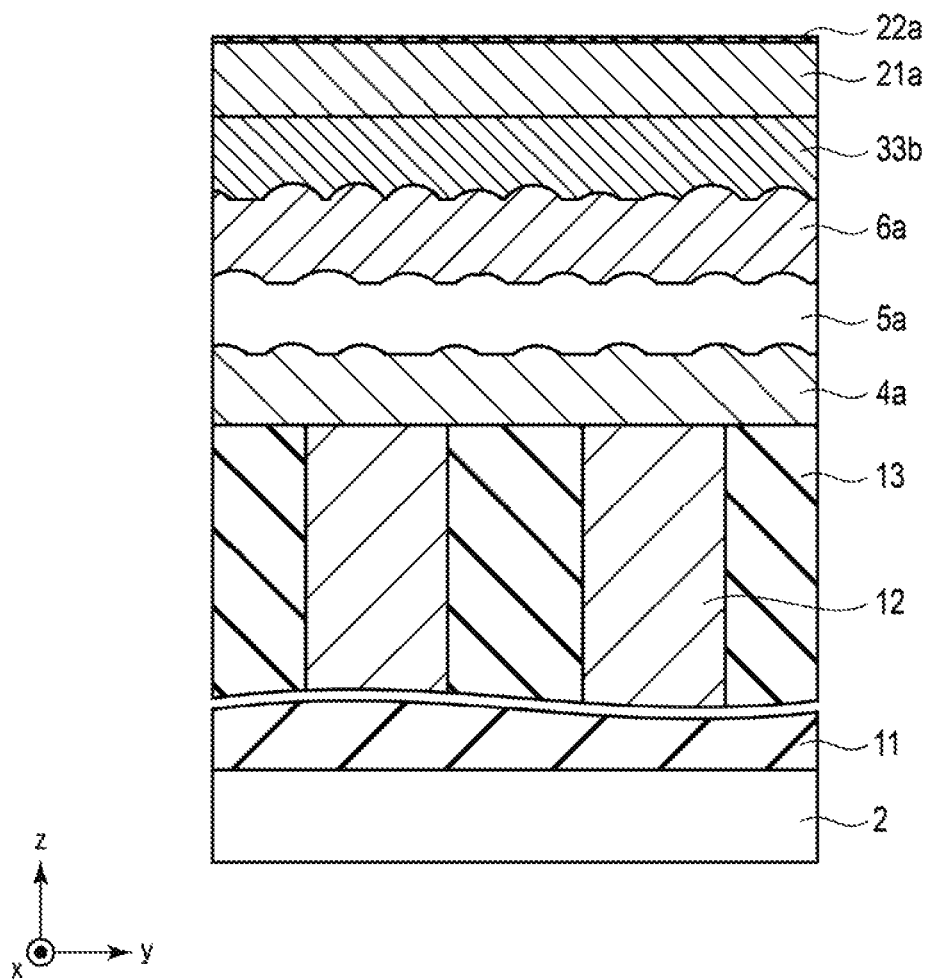
FIG. 14 illustrates further aspects of a manufacturing process of a magnetic storage device according to a third embodiment.

As illustrated in FIG. 14, the ferromagnetic material 21a and the nonmagnetic material 22a are sequentially deposited on the entirety of the upper surface of layer 33b by the same processing as depicted in FIG. 7. The upper surface of the layer 33b has a low roughness, and the upper surface of the ferromagnetic material 21a consequently also has a low roughness. Therefore, the nonmagnetic material 22a has a low roughness. After the processing depicted in FIG. 14 the processing is substantially similar to that depicted in of FIG. 8 for the first embodiment. By etching using the mask material 31 as a mask, the conductor 26a, the ferromagnetic material 23a, the nonmagnetic material 22a, the ferromagnetic material 21a, the layer 33b, the layer 6b, the layer 5a, and the layer 4a can be etched. After etching, the insulator 28, the conductor 29, and the insulator 30 are formed, whereby the structure of FIG. 11 is obtained.

According to the third embodiment, the layer 33b is formed on the upper surface of the layer 6a. Subsequently, the upper surface of the layer 33b is planarized to have a low roughness. Therefore, the ferromagnetic material 21a, formed on the upper surface of the layer 33b, also has an upper surface with a low roughness similar to the first embodiment. Thus, the same advantage as in the first embodiment may be obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a storage device, the method comprising:
   forming a state change layer on a substrate, the state change layer having a first resistance state and a second resistance state, the state change layer being switchable from one to the other of the first and second resistance states according to a magnitude of a voltage applied thereto;
   forming a conductor on an upper surface of the state change layer, the conductor comprising carbon;
   processing an upper surface of the conductor to reduce roughness thereof;
   forming a first ferromagnetic material on the upper surface of the conductor after the processing to reduce the roughness thereof;
   forming a nonmagnetic material on an upper surface of the first ferromagnetic material; and
   forming a second ferromagnetic material on an upper surface of the nonmagnetic material.

2. The method according to claim 1, wherein the conductor is carbon.

3. The method according to claim 1, wherein the state change layer comprises a chalcogenide.

4. The method according to claim 1, wherein the conductor is carbon, and the state change layer is a chalcogenide.

5. The method according to claim 1, wherein the processing to reduce the roughness of the upper surface of the conductor includes polishing the upper surface of the conductor.

6. The method according to claim 1, wherein the processing to reduce the roughness of the upper surface of the conductor is chemical mechanical polishing.

7. The method according to claim 1, wherein the processing to reduce the roughness of the upper surface of the conductor includes reverse sputtering on the upper surface of the conductor.

8. The method according to claim 1, wherein the processing to reduce the roughness of the upper surface of the conductor includes exposing the upper surface of the conductor to an ion beam.

9. A method of manufacturing a storage device, the method comprising:
   forming a state change layer on a substrate, the state change layer having a first resistance state and a second resistance state, the state change layer being switchable from one to the other of the first and second resistance states according to a magnitude of a voltage applied thereto;
   forming a first conductor on an upper surface of the state change layer, the first conductor comprising carbon;
   forming a second conductor on an upper surface of the first conductor;
   processing an upper surface of the second conductor to reduce roughness thereof;
   forming a first ferromagnetic material on the upper surface of the second conductor after the processing to the reduced roughness thereof;
   forming a nonmagnetic material on an upper surface of the first ferromagnetic material; and
   forming a second ferromagnetic material on an upper surface of the nonmagnetic material.

10. The method according to claim 9, wherein the first conductor is carbon.

11. The method according to claim 9, wherein the state change layer comprises a chalcogenide.

12. The method according to claim 9, wherein the first conductor is carbon, and the state change layer is a chalcogenide.

13. The method according to claim 9, wherein the processing to reduce the roughness of the upper surface of the second conductor includes polishing the upper surface of the second conductor.

14. The method according to claim 9, wherein the processing to reduce the roughness of the upper surface of the second conductor is chemical mechanical polishing.

15. The method according to claim 9, wherein the processing to reduce the roughness of the upper surface of the second conductor includes reverse sputtering on the upper surface of the second conductor.

16. The method according to claim 9, wherein the processing to reduce the roughness of the upper surface of the second conductor includes exposing the upper surface of the second conductor to an ion beam.

17. A method of manufacturing a storage device, the method comprising:
   forming a state change layer on a substrate, the state change layer having a first resistance state and a second resistance state switchable from one to the other of the first and second resistance states according to a magnitude of a voltage applied thereto;
   forming a conductor on an upper surface of the state change layer, the conductor comprising carbon;
   forming a buffer layer comprising a conductive material on an upper surface of the conductor, the buffer layer comprising a metal and having a lower surface with a first roughness and an upper surface with a second roughness that is less than the first roughness;
   forming a first ferromagnetic material on the upper surface of the buffer layer;
   forming a nonmagnetic material on an upper surface of the first ferromagnetic material; and
   forming a second ferromagnetic material on an upper surface of the nonmagnetic material.

18. The method according to claim 17, wherein the state change layer comprises a chalcogenide.

19. The method according to claim 17, wherein the buffer layer comprises at least one tantalum and titanium.

20. The method according to claim 17, wherein forming the buffer layer comprises polishing the upper surface of the buffer layer.

* * * * *